US 7,732,888 B2

(12) United States Patent
Raberg et al.

(10) Patent No.: US 7,732,888 B2
(45) Date of Patent: Jun. 8, 2010

(54) INTEGRATED CIRCUIT, METHOD FOR MANUFACTURING AN INTEGRATED CIRCUIT, MEMORY CELL ARRAY, MEMORY MODULE, AND DEVICE

(75) Inventors: Wolfgang Raberg, Saurbach (DE); Cay-Uwe Pinnow, Corbeil Essonnes (FR)

(73) Assignees: Qimonda AG, Munich (DE); Altis Semiconductor, SNC, Corbeil Essonnes Cedex (FR)

( * ) Notice: Subject to any disclaimer, the term of this patent is extended or adjusted under 35 U.S.C. 154(b) by 368 days.

(21) Appl. No.: 11/735,864

(22) Filed: Apr. 16, 2007

(65) Prior Publication Data
US 2008/0253166 A1 Oct. 16, 2008

(51) Int. Cl.
*H01L 29/51* (2006.01)
(52) U.S. Cl. .................. 257/499; 257/2; 257/4; 257/40; 257/522; 257/E29.087; 257/E31.008; 438/95; 438/421; 438/900
(58) Field of Classification Search .......... 257/499, 257/E31.008, E29.087, 2, 4, 40; 438/95, 438/900
See application file for complete search history.

(56) References Cited
U.S. PATENT DOCUMENTS

| | | | |
|---|---|---|---|
| 6,492,288 B2 | 12/2002 | Shindo | |
| 6,597,062 B1 * | 7/2003 | Li et al. | 257/686 |
| 7,227,171 B2 | 6/2007 | Bez | |
| 7,279,742 B2 | 10/2007 | Grüning-Von Schwerin | |
| 7,319,235 B2 | 1/2008 | Happ | |
| 7,358,520 B2 | 4/2008 | Pinnow et al. | |
| 2002/0058578 A1 | 5/2002 | Shindo | |
| 2005/0212037 A1 | 9/2005 | Pinnow et al. | |
| 2005/0285095 A1 * | 12/2005 | Happ | 257/2 |
| 2006/0189045 A1 * | 8/2006 | Shum et al. | 438/148 |
| 2006/0204776 A1 | 9/2006 | Chen et al. | |
| 2006/0255427 A1 * | 11/2006 | Giraudin et al. | 257/532 |
| 2007/0052040 A1 | 3/2007 | Schwerin | |
| 2007/0135550 A1 * | 6/2007 | Chakrapani et al. | 524/406 |
| 2008/0017842 A1 * | 1/2008 | Happ et al. | 257/4 |

FOREIGN PATENT DOCUMENTS

| | | |
|---|---|---|
| DE | 103 61 695 B3 | 2/2005 |
| DE | 10 2004 011 430 A1 | 9/2005 |
| DE | 10 2004 031 135 A1 | 1/2006 |
| DE | 10 2005 001 902 A1 | 7/2006 |
| DE | 600 26 122 T2 | 9/2006 |
| DE | 10 2006 027 880 A1 | 12/2007 |
| EP | 1 193 227 A1 | 4/2002 |
| WO | WO 2007/141048 A1 | 12/2007 |

OTHER PUBLICATIONS

Hussein, M. A., et al., "Materials' Impact on Interconnect Process Technology and Reliability," IEEE Transactions on Semiconductor Manufacturing, vol. 18, No. 1, Feb. 2005, pp. 69-85.

* cited by examiner

*Primary Examiner*—Davienne Monbleau
*Assistant Examiner*—Farid Khan

(57) ABSTRACT

According to one embodiment of the present invention, a memory cell array comprises a plurality of voids, the spatial positions and dimensions of the voids being chosen such that mechanical stress occurring within the memory cell array is at least partly compensated by the voids.

28 Claims, 11 Drawing Sheets

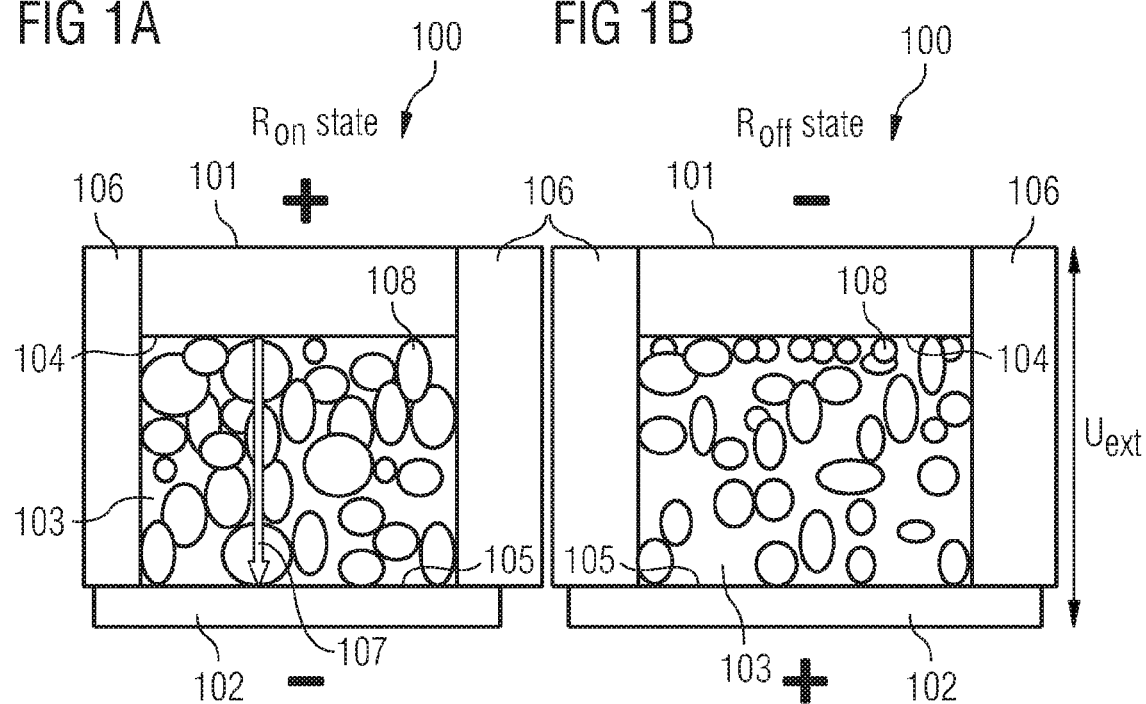
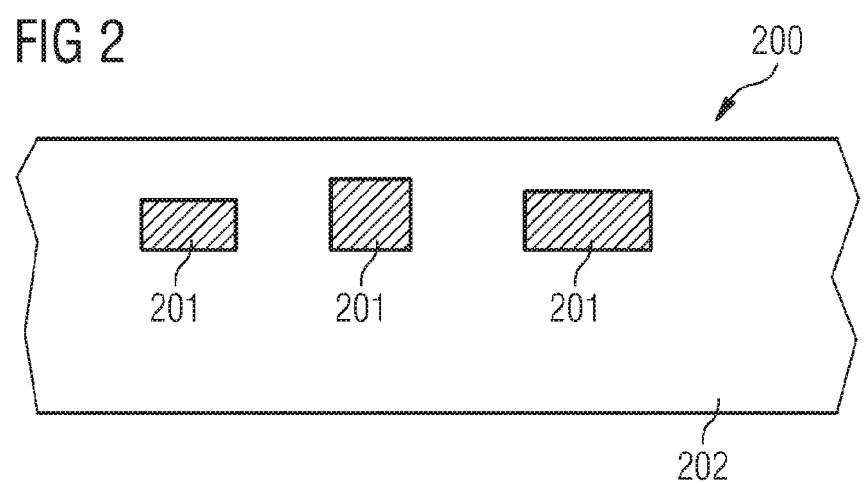

Top down view of CBRAM cell array with SC contacts (bottom electrode cell contacts)

The dielectric (or semiconducting) film is deposited over the PL structure so that the overhang of two neighboring PL covering film pieces coagulate and form a void During further (high) temperature annealing (BEOL processing) the PL material can expand without destroying/delaminating the PL/encapsulation structure

FIG 5A at room temperature:

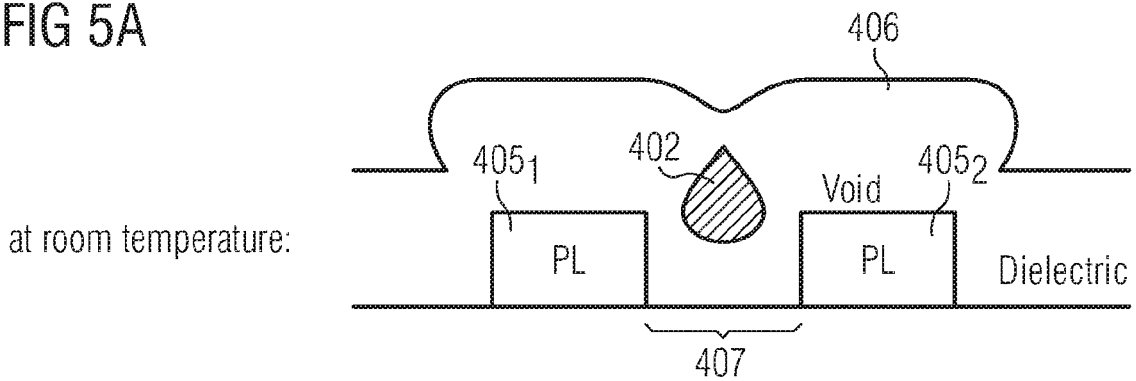

FIG 5B

During BEOL processing (e.g. During anneal at 430°C)
The PL material expands significantly, while the voids shrink

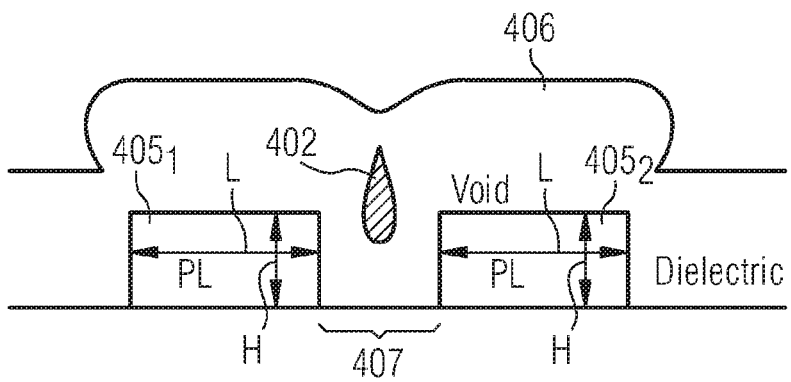

FIG 5C

After BEOL anneal the PL material shrinks again and due to the enhaced flexibility of the void containing dielectric the structure does neither degrade nor delaminate

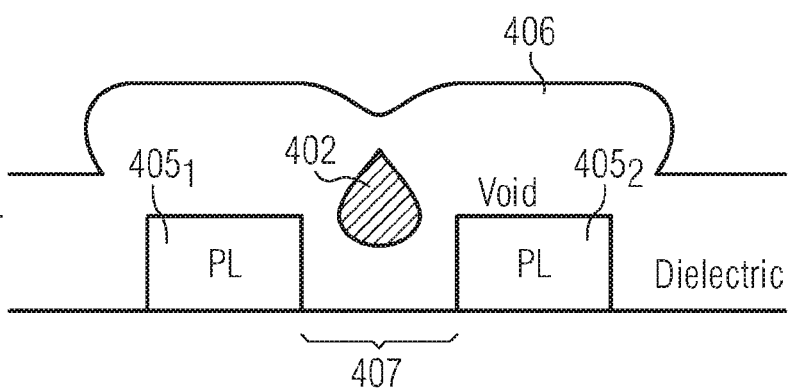

A dielectric (or semiconducting) film is deposited over the PL structure so that there is a certain overhang during the (CVD) deposition

- Sidewall step coverage = b/a
- Bottom step coverage = d/a
- Conformity = b/c
- Overhang = (c-b)/b
- Aspect ratio = h/w Location of contacts below active material indicated by dashed Deposition of active layer on Substrate with plugs Lithography after deposition of top electrode and hard mask Etch of hard-mask and active layer Deposition of nanoporous material and CMP down to hardmask Deposition of ILD and thermal stress Behavior of device during thermal stress

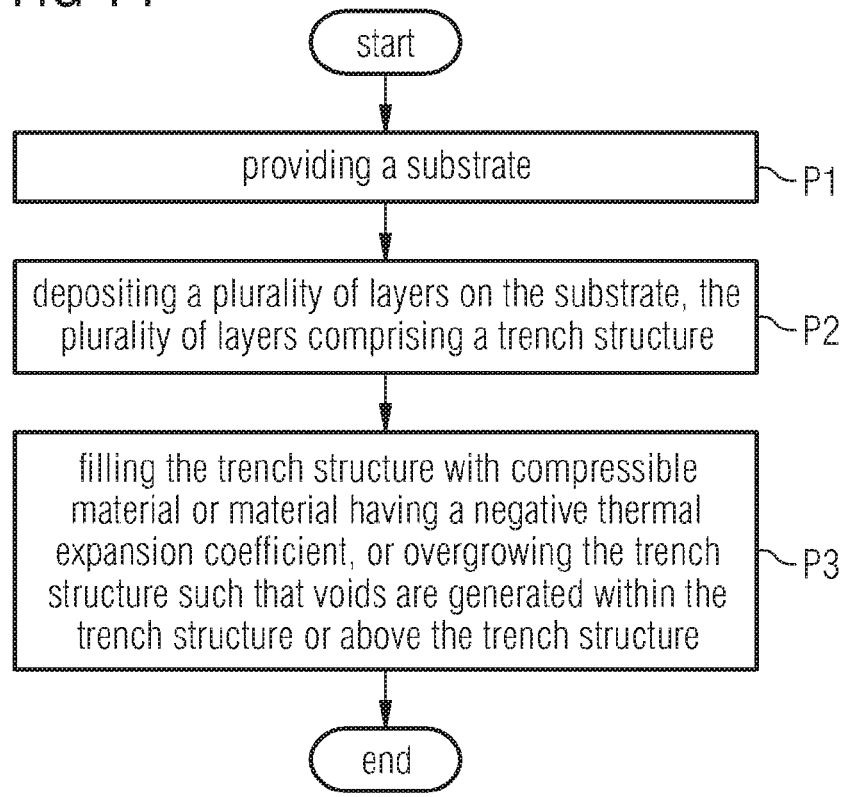
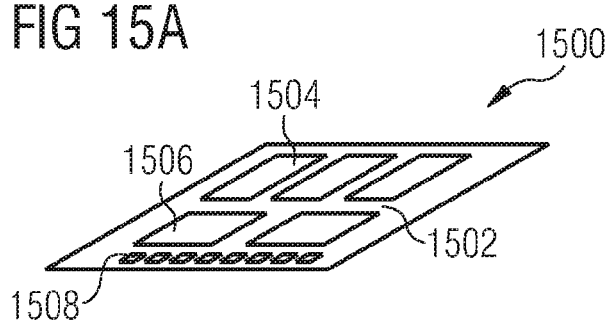
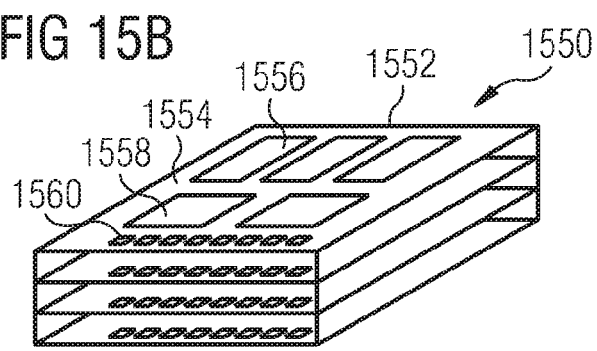

INTEGRATED CIRCUIT, METHOD FOR MANUFACTURING AN INTEGRATED CIRCUIT, MEMORY CELL ARRAY, MEMORY MODULE, AND DEVICE

BRIEF DESCRIPTION OF THE DRAWINGS

For a more complete understanding of exemplary embodiments of the present invention, reference is now made to the following description taken in conjunction with the accompanying drawings, in which:

FIG. 1a shows a schematic cross-sectional view of a CBRAM cell set to a first memory state;

FIG. 1b shows a schematic cross-sectional view of a CBRAM cell set to a second memory state;

FIG. 2 shows a schematic cross-sectional view of a part of a memory cell array according to one embodiment of the present invention;

FIG. 5a shows a schematic cross-sectional view of a processing stage of one embodiment of the method according to the present invention;

FIG. 5b shows a schematic cross-sectional view of a processing stage of one embodiment of the method according to the present invention;

FIG. 5c shows a schematic cross-sectional view of a processing stage of one embodiment of the method according to the present invention;

FIG. 7b shows a schematic cross-sectional view of the processing stage shown in FIG. 7a;

FIG. 8b shows a schematic cross-sectional view of the processing stage shown in FIG. 8a;

FIG. 9b shows a schematic cross-sectional view of the processing stage shown in FIG. 9a;

FIG. 10b shows a schematic cross-sectional view of the processing stage shown in FIG. 10a;

FIG. 11b shows a schematic cross-sectional view of the processing stage shown in FIG. 11a;

FIG. 14 shows a flow chart of the method of manufacturing a memory cell array according to one embodiment of the present invention;

FIG. 15a shows a memory module according to one embodiment of the present invention;

FIG. 15b shows a memory module according to one embodiment of the present invention;

DETAILED DESCRIPTION OF ILLUSTRATIVE EMBODIMENTS

Figure 3:
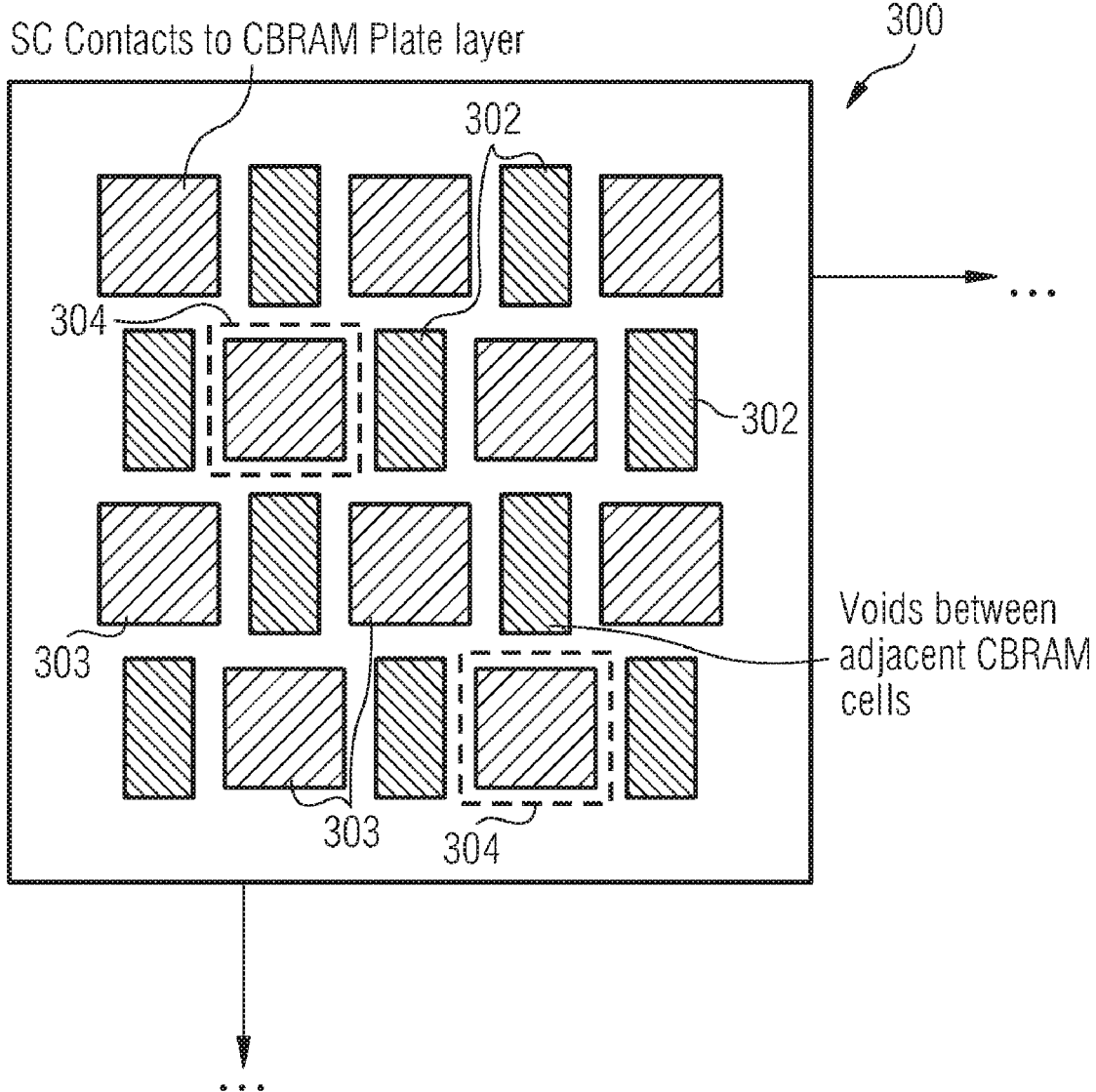
FIG. 3 shows a schematic top view of a part of a memory cell array according to one embodiment of the present invention.

According to one embodiment of the present invention, a device comprising a plurality of voids is provided, the spatial positions and dimensions of the voids being chosen such that mechanical stress occurring within the device is at least partly compensated by the voids. The device may be an arbitrary device like a motherboard circuit of a personal computer.

According to one embodiment of the present invention, a memory cell array including a plurality of voids is provided, the spatial positions and dimensions of the voids being chosen such that mechanical stress occurring within the memory cell array is at least partly compensated by the voids.

According to a further embodiment of the present invention, a memory cell array including a plurality of mechanical stress compensation areas is provided, each stress compensation area including compressible material or material having a negative thermal expansion coefficient. The spatial positions and dimensions of the stress compensation areas are chosen such that mechanical stress occurring within the memory cell array is at least partly compensated by the stress compensation areas.

According to one embodiment of the present invention, an integrated circuit including a memory cell array including a plurality of voids is provided, wherein the spatial positions and dimensions of the voids are chosen such that mechanical stress occurring in the memory cell array is at least partly compensated by the voids.

Further, according to one embodiment of the present invention, a memory cell array including a plurality of voids is provided, wherein the spatial positions and dimensions of the voids are chosen such that mechanical stress occurring in the memory cell array is at least partly compensated by the voids.

For sake of simplicity, the following embodiments are described in conjunction with a memory cell array. However, all embodiments can be applied in an analogous manner to an integrated circuit which includes such a memory cell array.

Memory cell arrays according to this embodiment may be exposed to high mechanical stress since a stress compensation structure (voids) is included into the memory cell array which compensates mechanical stress resulting, for example, from high temperatures or from other influences to which the memory cell array is exposed. As a consequence, the fabrication process of the memory cell array becomes more flexible.

According to one embodiment of the present invention, at least a part of at least one void is filled with compressible material or material having a negative thermal expansion coefficient. According to one embodiment of the present invention, the compressible material is material that is easier to compress than the materials surrounding the compressible material. According to one embodiment of the present invention, the compressible material is nanoporous material.

Generally, the memory cell arrays according to the present invention may be any kind of memory cell arrays. For example, the memory cell array may be a resistive memory cell array or a non-volatile memory cell array. The present invention is not restricted to these examples.

Generally, the voids may be located at arbitrary positions within the memory cell arrays. For example, at least a part of at least one void may be arranged within an active material layer of the memory cell array. A further possibility is to arrange all voids within the active material layer. At least a part of the voids or all voids may be located within at least one dielectric material layer. The at least one dielectric material layer may be disposed above the active material layer, for example, cover the active material layer, or cover an electrode layer disposed above the active material layer.

According to one embodiment of the present invention, the memory cell array is a programmable metallization cell (PMC) array. The programmable metallization cell (PMC) array may be a solid electrolyte cell array like a solid electrolyte random access memory (CBRAM=conductive bridging random access memory) cell array including a reactive electrode layer, an inert electrode layer, and a solid electrolyte layer being positioned between the reactive electrode layer and the inert electrode layer, the solid electrolyte layer being electrically connected to the reactive electrode layer and the inert electrode layer. In this embodiment, at least a part of at least one void may be located within the solid electrolyte layer or within the inert electrode layer or within the reactive electrode layer. The memory cell array may also be a phase changing memory cell array like a phase changing random access memory (PCRAM) cell array, a magneto-resistive memory cell array like a magneto-resistive random access memory (MRAM) cell array, or an organic memory cell array like an organic random access memory (ORAM) cell array.

According to one embodiment of the present invention, the material having a negative thermal expansion coefficient is $ZrW_2O_8$ (zirconium-tungsten-oxide). More generally, the material having a negative thermal expansion coefficient may be a compound.

According to one embodiment of the present invention, an integrated circuit including a memory cell array including a plurality of mechanical stress compensation areas is provided. Each stress compensation area includes compressible material or material having a negative thermal expansion coefficient. The spatial positions and dimensions of the stress compensation areas are chosen such that mechanical stress occurring within the memory cell array is at least partly compensated by the stress compensation areas.

Further, according to one embodiment of the present invention, a memory cell array including a plurality of mechanical stress compensation areas is provided. Each stress compensation area includes compressible material or material having a negative thermal expansion coefficient. The spatial positions and dimensions of the stress compensation areas are chosen such that mechanical stress occurring within the memory cell array is at least partly compensated by the stress compensation areas.

For sake of simplicity, the following embodiments are described in conjunction with a memory cell array. However, all embodiments can be applied in an analogous manner to an integrated circuit which includes such a memory cell array.

Memory cell arrays according to this embodiment may be exposed to high mechanical stress since a stress compensation area is included into the memory cell array which compensates mechanical stress resulting, for example, from high temperatures or from other influences to which the memory cell array is exposed. As a consequence, the fabrication process of the memory cell array becomes more flexible.

According to one embodiment of the present invention, at least one stress compensation area includes a trench structure, the trench structure being at least partially filled with compressible material or material having a negative thermal expansion coefficient. Alternatively or additionally, the trench structure may include a void structure.

Generally, the stress compensation areas may be located at arbitrary positions within the memory cell arrays. For example, at least a part of at least one stress compensation area may be arranged within an active material layer of the memory cell array. A further possibility is to arrange all stress compensation areas within the active material layer.

In case that the memory cell array is a solid electrolyte random access memory (CBRAM) cell array, at least a part of at least one stress compensation area may be located within the solid electrolyte layer or within the inert electrode layer or within the reactive electrode layer. At least a part or all stress compensation areas may be located within at least one dielectric material layer being disposed above the active material layer or above an electrode layer.

According to one embodiment of the present invention, in addition to the stress compensation areas, the memory cell array further includes a plurality of voids, wherein the spatial positions and dimensions of the voids are chosen such that mechanical stress occurring within the memory cell array is at least partly compensated by the voids.

According to one embodiment of the present invention, a method of manufacturing a memory cell array is provided, including the following processes:
    providing a substrate,
    depositing a plurality of layers on the substrate, the plurality of layers including a trench structure,
    overgrowing the trench structure such that voids are generated within the trench structure and/or above the trench structure.

According to one embodiment of the present invention, the process of overgrowing the trench structure includes a (non conform) trench filling process in which trench filling material is filled into the trench structure, the trench filling process being carried out such that overhangs of trench filling material are grown at the edges of the trench structure opening area.

According to one embodiment of the present invention, the trench filling process is carried out until overhangs growing on trench structure opening area edges facing each other touch each other.

At least a part of the trench structure may be generated within an active material layer and/or a dielectric material layer being part of the plurality of layers.

According to one embodiment of the present invention, a method of manufacturing a memory cell array is provided, including the following processes:
    providing a substrate, depositing a plurality of layers on the substrate, the plurality of layers including a trench structure, filling the trench structure with compressible material or material having a negative thermal expansion coefficient.

According to one embodiment of the present invention, at least a part of the trench structure is generated within a plug layer including a plurality of plugs which contact an active material layer or contact an electrode layer of the memory cell array.

According to one embodiment of the present invention, a back end of line process is carried out after the trench structure has been overgrown or after having filled the trench structure with compressible material or material having a negative thermal expansion coefficient.

According to one embodiment of the present invention, the process of overgrowing the trench structure or the process of filling the trench structure with compressible material or material having a negative thermal expansion coefficient is carried out at a temperature being lower than 400° C. in order to avoid damages (e.g., delamination damages) within the active material layer or other parts of the memory cell array.

At least a part of the trench structure may be generated within an active material layer and/or a dielectric material layer being part of the plurality of layers.

According to one embodiment of the present invention, the material filled into the trench structure or the material overgrowing the trench structure includes insulating material or semiconducting material, for example, silicon oxide ($SiO_2$), silicon nitride (SiN), germanium oxide (GeO) or germanium nitride (GeN).

Memory cell arrays usually comprise a plurality of different materials. The thermal expansion coefficients of these materials may significantly differ from each other. As a consequence, the memory cell array may be damaged when being exposed to high temperatures (delamination damage). According to one embodiment of the present invention, damage within memory cell arrays resulting from different thermal expansion coefficients is reduced.

Since the embodiments of the present invention can be applied to programmable metallization cell devices (PMC) (e.g., solid electrolyte devices like CBRAM (conductive bridging random access memory) devices), in the following description, making reference to FIGS. 1a and 1b, a basic principle underlying embodiments of CBRAM devices will be explained.

As shown in FIG. 1a, a CBRAM cell 100 includes a first electrode 101 a second electrode 102, and a solid electrolyte block (in the following also referred to as ion conductor block) 103 which includes the active material and which is sandwiched between the first electrode 101 and the second electrode 102. This solid electrolyte block 103 can also be shared between a large number of memory cells (not shown here). The first electrode 101 contacts a first surface 104 of the ion conductor block 103, the second electrode 102 contacts a second surface 105 of the ion conductor block 103. The ion conductor block 103 is isolated against its environment by an isolation structure 106. The first surface 104 usually is the top surface, the second surface 105 the bottom surface of the ion conductor 103. In the same way, the first electrode 101 generally is the top electrode, and the second electrode 102 the bottom electrode of the CBRAM cell. One of the first electrode 101 and the second electrode 102 is a reactive electrode, the other one an inert electrode. Here, the first electrode 101 is the reactive electrode, and the second electrode 102 is the inert electrode. In this example, the first electrode 101 includes silver (Ag), the ion conductor block 103 includes silver-doped chalcogenide material, the second electrode 102 includes tungsten (W), and the isolation structure 106 includes $SiO_2$. The present invention is however not restricted to these materials. For example, the first electrode 101 may alternatively or additionally include copper (Cu) or zink (Zn), and the ion conductor block 103 may alternatively or additionally include copper-doped chalcogenide material. Further, the second electrode 102 may alternatively or additionally include nickel (Ni) or platinum (Pt), iridium (Ir), rhenium (Re), tantalum (Ta), titanium (Ti), ruthenium (Ru), molybdenum (Mo), vanadium (V), conductive oxides, silicides, and nitrides of the aforementioned compounds, and can also include alloys of the aforementioned metals or materials. The thickness of the ion conductor 103 may, for example, range between 5 nm and 500 nm. The thickness of the first electrode 101 may, for example, range between 10 nm and 100 nm. The thickness of the second electrode 102 may, for example, range between 5 nm and 500 nm, between 15 nm to 150 nm, or between 25 nm and 100 nm. It is to be understood that the present invention is not restricted to the above-mentioned materials and thicknesses.

In the context of this description, chalcogenide material (ion conductor) is understood, for example, to be any compound containing oxygen, sulphur, selenium, germanium and/or tellurium. In accordance with one embodiment of the invention, the ion conducting material is, for example, a compound, which is made of a chalcogenide and at least one metal of the group I or group II of the periodic system, for example, arsenic-trisulfide-silver. Alternatively, the chalcogenide material contains germanium-sulfide ($GeS_x$), germanium-selenide ($GeSe_x$), tungsten oxide ($WO_x$), copper sulfide ($CuS_x$) or the like. The ion conducting material may be a solid state electrolyte. Furthermore, the ion conducting material can be made of a chalcogenide material containing metal ions, wherein the metal ions can be made of a metal, which is selected from a group consisting of silver, copper and zinc or of a combination or an alloy of these metals.

If a voltage as indicated in FIG. 1a is applied across the ion conductor block 103, a redox reaction is initiated which drives $Ag^+$ ions out of the first electrode 101 into the ion conductor block 103 where they are reduced to Ag, thereby forming Ag rich clusters 108 within the ion conductor block 103. If the voltage applied across the ion conductor block 103 is applied for an enhanced period of time, the size and the number of Ag rich clusters within the ion conductor block 103 is increased to such an extent that a conductive bridge 107 between the first electrode 101 and the second electrode 102 is formed. In case that a voltage is applied across the ion conductor 103 as shown in FIG. 1b (inverse voltage compared to the voltage applied in FIG. 1a), a redox reaction is initiated which drives $Ag^+$ ions out of the ion conductor block 103 into the first electrode 101 where they are reduced to Ag. As a consequence, the size and the number of Ag rich clusters within the ion conductor block 103 is reduced, thereby erasing the conductive bridge 107. After having applied the voltage/inverse voltage, the memory cell 100 remains within the corresponding defined switching state even if the voltage/inverse voltage has been removed.

In order to determine the current memory status of a CBRAM cell, for example, a sensing current is routed through the CBRAM cell. The sensing current experiences a high resistance in case no conductive bridge 107 exists within the CBRAM cell, and experiences a low resistance in case a conductive bridge 107 exists within the CBRAM cell. A high resistance may, for example, represent "0", whereas a low resistance represents "1", or vice versa. The memory status detection may also be carried out using sensing voltages.

FIG. 2 shows an embodiment of the memory cell array according to the present invention. A memory cell array 200 includes a plurality of voids and/or mechanical stress compensation areas 201 embedded into memory cell array materials which are summarized by reference numeral 202, wherein the spatial positions and dimensions of the voids and/or the mechanical stress compensation areas 201 are chosen such that mechanical stress occurring within the memory cell array 200 (within the memory cell array materials 202) is at least partly compensated by the voids and the mechanical stress compensation areas 201.

FIG. 3 shows a memory cell array 300 comprising a plurality of voids 302, wherein the spatial positions and dimensions of the voids 302 are chosen such that mechanical stress occurring within the memory cell array 300 is at least partly compensated by the voids 302. The voids 302 are, for example, located within an active material layer (not shown) arranged above bottom electrodes 303 (the voids are, for example, located between structured PL areas (PL includes the chalcogenide material and may include top electrode material)), the lateral positions of the voids 302 lying between the lateral positions of the bottom electrodes 303. In other words, the voids 302 lie between memory cells 304 of the memory cell array 300 (the area of the active material layer positioned above a bottom electrode 303, together with the bottom electrode 303 and a top electrode (not shown) positioned above the active material layer forms a memory cell 304). At least a part of at least one void 302 may be filled with compressible material or material having a negative thermal expansion coefficient. The compressible material may for example be nanoporous material. The material having a negative thermal expansion coefficient may, for example, be $ZrW_2O_8$.

If the memory cell array 300 is subjected to a high temperature, for example during an annealing process, the bottom electrodes 303 and the top electrodes (not shown) will expand relatively strong (compared to other materials of the memory cell array 300), thereby causing mechanical stress within the memory cell array 300. The stress caused by the bottom electrodes 303 and the top electrodes are at least partly compensated by the voids 302. The spatial dimensions of the voids 302 are reduced when the bottom electrodes 303 and the top electrodes expand, thereby compensating the mechanical stress caused by the expansion of the bottom electrodes 303 and the top electrodes.

Figure 4A:
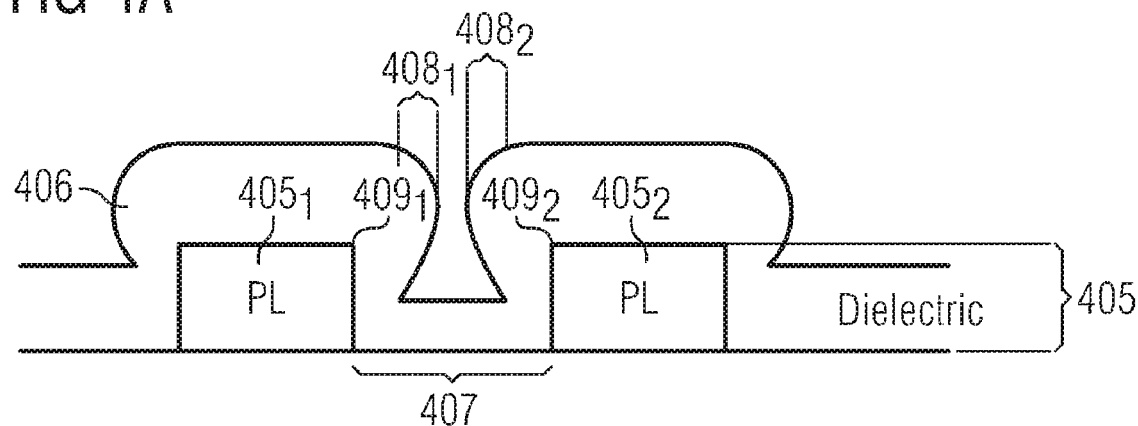
FIG. 4a shows a schematic cross-sectional view of a processing stage of one embodiment of the method according to the present invention.
Figure 4B:
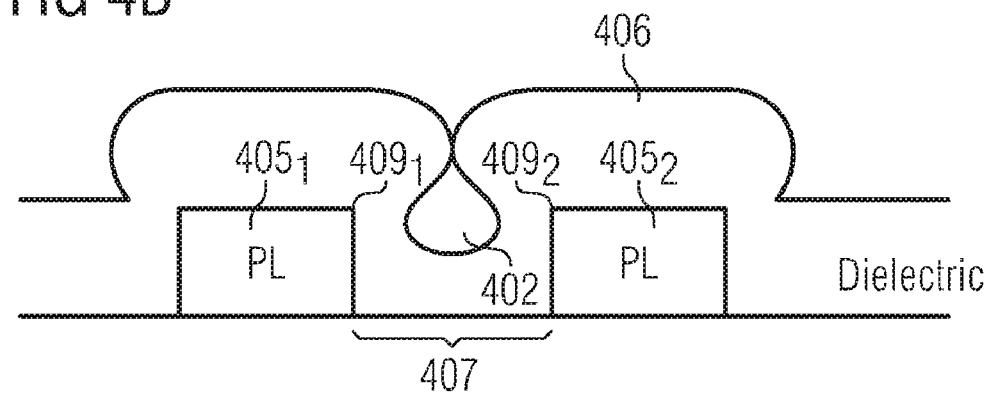
FIG. 4b shows a schematic cross-sectional view of a processing stage of one embodiment of the method according to the present invention.
Figure 4C:
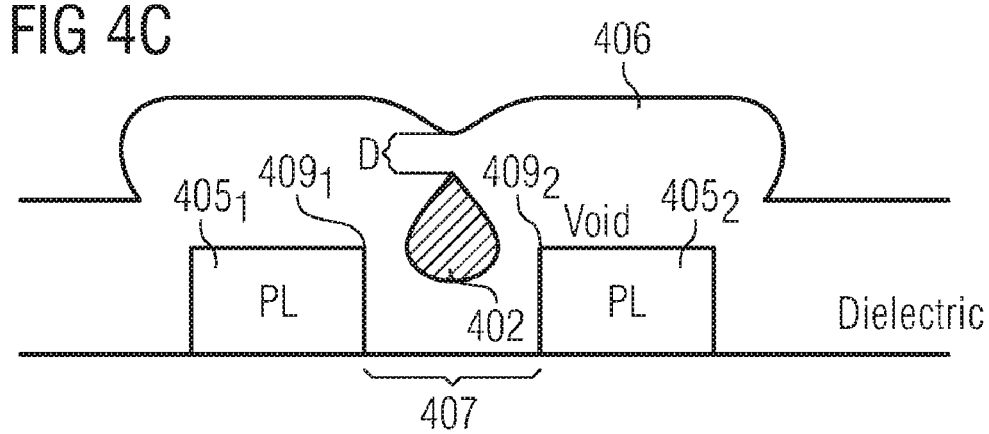
FIG. 4c shows a schematic cross-sectional view of a processing stage of one embodiment of the method according to the present invention.

FIG. 4a shows a processing stage of one embodiment of the method according to the present invention. In the processing stage shown in FIG. 4b, an active material layer 405 (for example, a chalcogenide layer) has been patterned, thereby obtaining a first active material region 405₁ and a second active material region 405₂. After having patterned the active material layer 405, a trench filling process is carried out in which trench filling material 406 (for example, dielectric material or semiconducting material) is filled into a trench structure 407 being positioned between the first active material region 405₁ and the second active material region 405₂ (the trench structure results from the patterning process mentioned above). The trench filling process may, for example, be carried out using a chemical vapour deposition (CVD) process. The trench filling process is carried out such that overhangs 408 of trench filling material 406 are grown at the edges 409 of a trench opening area. The trench filling process may be carried out at least until the overhangs 408₁, 408₂ growing on trench structure opening area edges 409 facing each other (first opening area edge 409₁ and second opening area edge 409₂) touch each other, as shown in FIG. 4b. In this way, a void 402 is generated, a first part of which being positioned within the trench structure 407, and a second part of which being positioned above the trench structure 407. The trench filling process may be carried out until the void 402 is covered with a predetermined thickness D of trench filling materials 406, as shown in FIG. 4c. This ensures that the layer of trench filling material 406 will not delaminate in case a high mechanical stress occurs within the trench filling material 406. Further layers may be deposited above the trench filling materials 406 during a back end of line process, for example.

FIG. 5a shows the structure shown in FIG. 4c before subjecting the structure to an annealing process (for example, at room temperature). The annealing process (which may, for example, occur during a back and of line (BEOL) process) which may, for example, have a temperature of 430° C. effects that the first active material region 405₁ as well as the second active material region 405₂ expand vertically (indicated by arrow "H") and laterally (indicated by arrow "L"). The expansion of the first active material region 405₁ and the second active material region 405₂ causes mechanical stress within the structure. This mechanical stress is compensated by decreasing the spatial dimensions of the void 402, as shown in FIG. 5b. As soon as the annealing process ends, the spatial dimensions of the first active material region 405₁ and the second active material region 405₂ decrease, whereas the spatial dimensions of the void 402 increase (see FIG. 5c). In this way, the active material layer 405 can expand without destroying/delaminating the trench filling material 406 (more generally, without destroying/delaminating an active material encapsulation structure).

Figure 6:
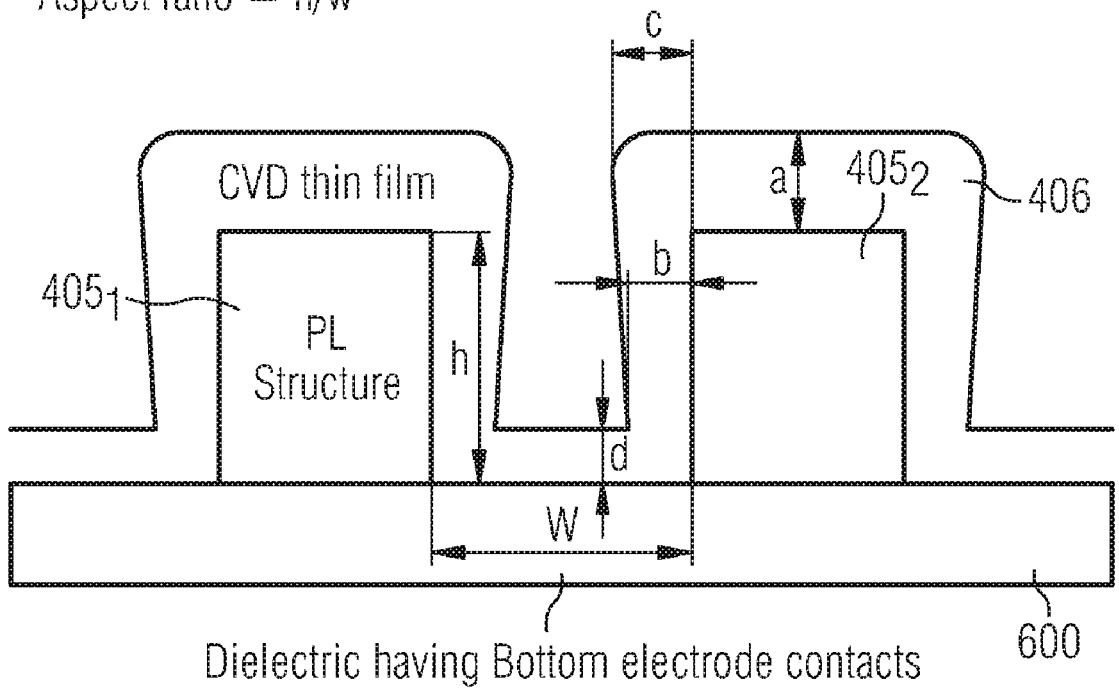
FIG. 6 shows a schematic cross-sectional view of the processing stage shown in FIG. 4a in a more detailed manner.

FIG. 6 shows the processing stage shown in FIG. 4a in more detail, where the first active material region 405₁ and the second active material region 405₂ are deposited on a carrier structure 600, for example, a dielectric having bottom electrode contacts.

Figure 7A:
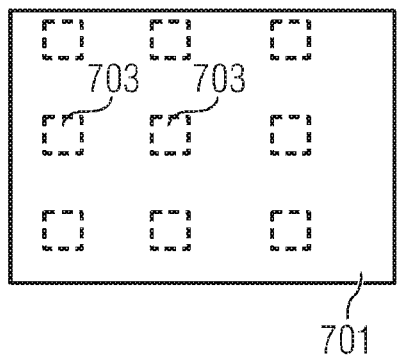
FIG. 7a shows a schematic top view of a processing stage of one embodiment of the method according to the present invention.
Figure 7B:
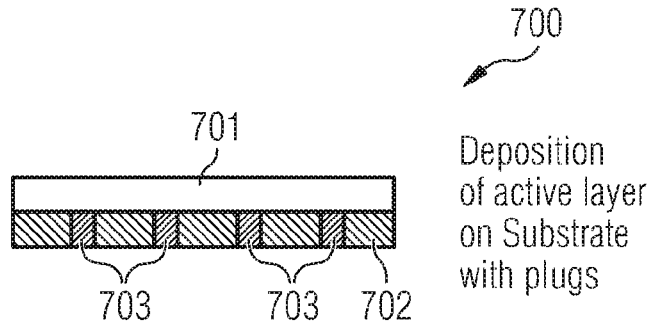
Figure 8A:
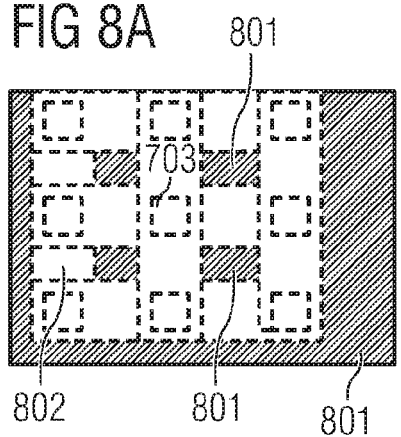
FIG. 8a shows a schematic top view of a processing stage of one embodiment of the method according to the present invention.
Figure 8B:
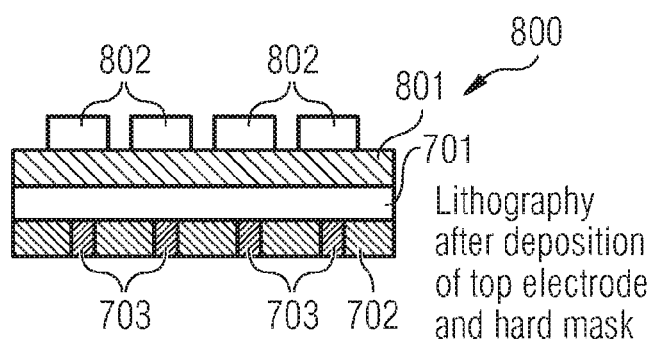
Figure 9A:
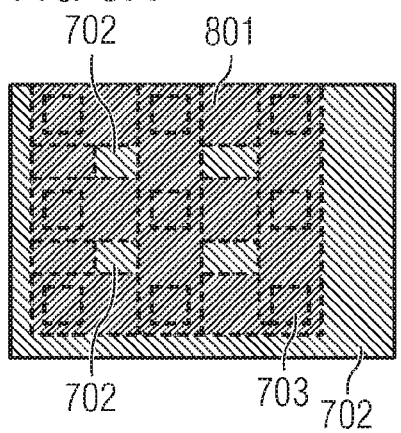
FIG. 9a shows a schematic top view of a processing stage of one embodiment of the method according to the present invention.
Figure 9B:
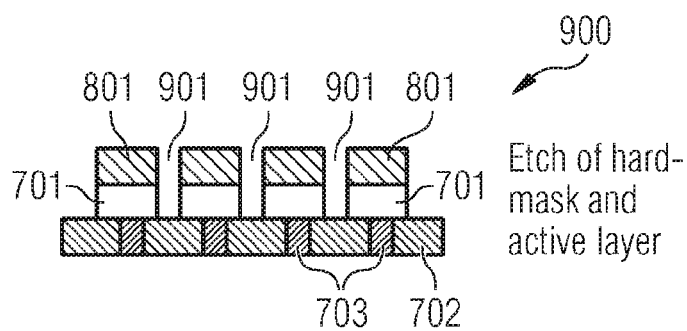
Figure 10A:
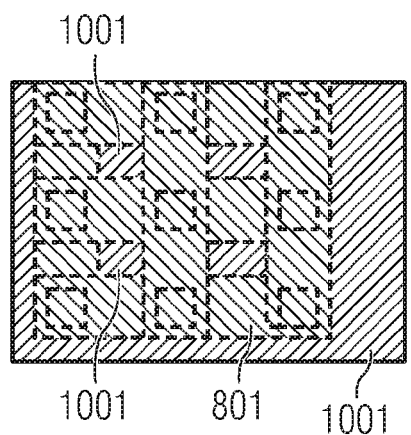
FIG. 10a shows a schematic top view of a processing stage of one embodiment of the method according to the present invention.
Figure 10B:
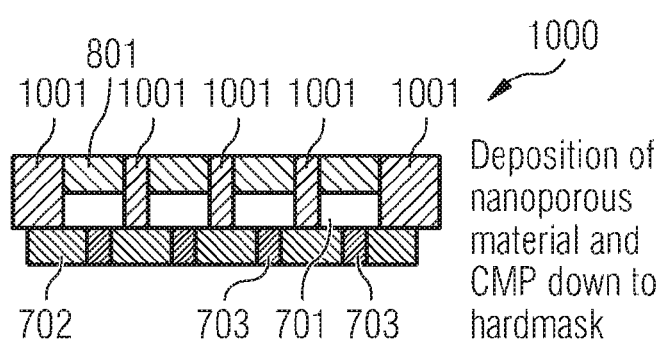
Figure 11A:
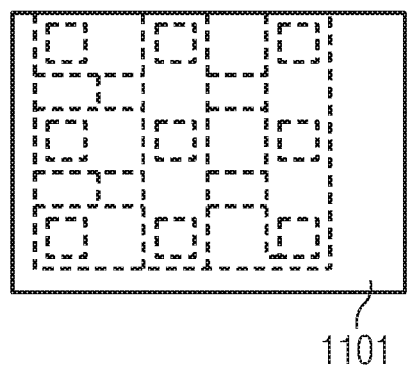
FIG. 11a shows a schematic top view of a processing stage of one embodiment of the method according to the present invention.
Figure 11B:
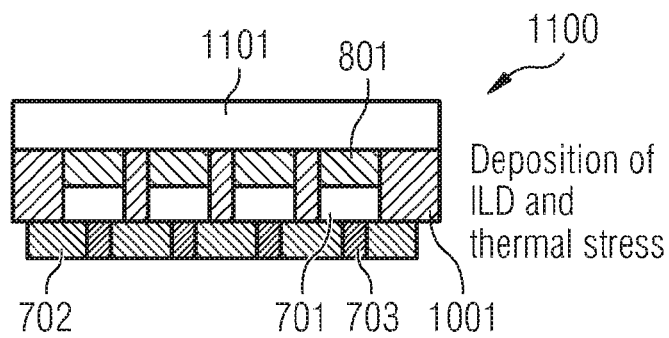

FIGS. 7a and 7b show a processing stage 700 of a memory cell manufacturing process according to one embodiment of the present invention in which an active material layer 701 (for example, a chalcogenide layer) has been provided on a substrate layer 702 comprising a plurality of bottom electrodes 703. FIGS. 8a and 8b show a processing stage 800 in which a top electrode layer 801 has been provided on the active material layer 701. Further, a patterned mask layer 802 has been provided on the top electrode layer 801. The electrode layer 801 can be used as a hardmask in the manufacturing process. FIGS. 9a and 9b show a processing stage 900 in which a trench structure 901 has been generated within a composite structure comprising the top electrode layer 801 and the active material layer 701. The trench structure 901 may, for example, be generated by an etching process using the mask layer 802. Here, it is shown to etch completely down to the substrate layer 702. Alternatively, it may be sufficient to etch only a part of the active material layer 701 or of the top electrode layer 801. FIGS. 10a and 10b show a processing stage 1000 in which the trench structure 901 has been filled with filling material 1001 which is a compressible material (for example, nanoporous material) or material having a negative thermal expansion coefficient. In FIGS. 11a and 11b, a processing stage 1100 is shown in which a dielectric layer 1101 (ILD layer) has been provided on the top surface of the structure shown in FIGS. 10a and 10b. Before this process, a chemical mechanical polishing process (CMP) may be carried out in order to obtain a uniform surface.

Figure 12:
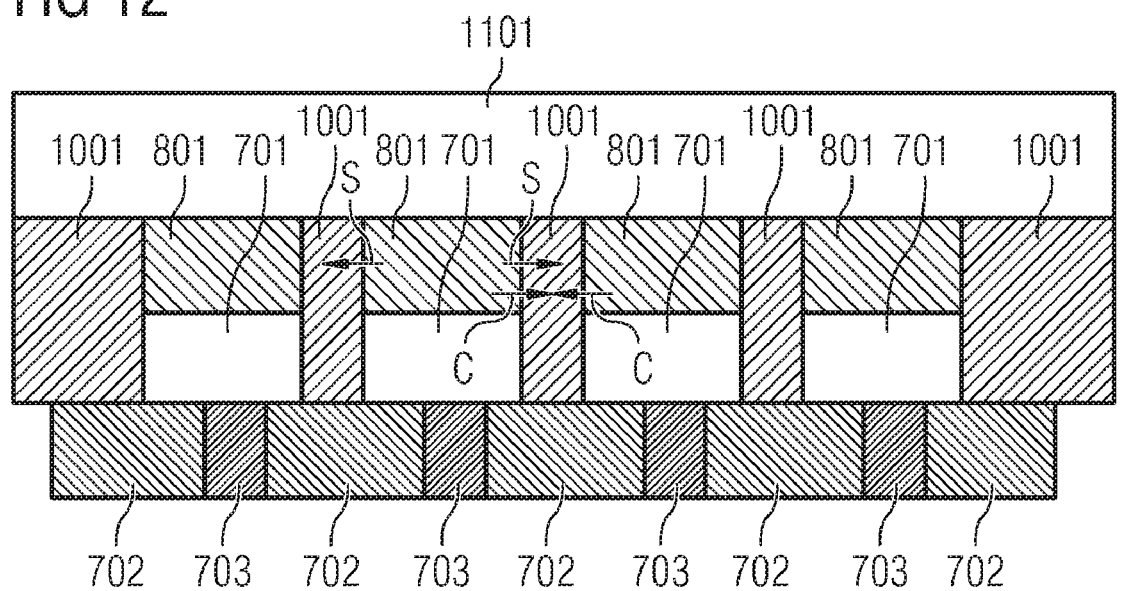
FIG. 12 shows a schematic cross-sectional view of the memory cell array shown in FIG. 11b and its behaviour during a high temperature treatment.

FIG. 12 shows the structure shown in FIGS. 11a, 11b during an annealing process of the structure. As can be derived from FIG. 12, mechanical stress indicated by arrows "S" (expansion of the patterned top electrode layer 801) is compensated by the filling material 1001, the spatial dimensions of which decrease due to a negative thermal expansion coefficient or due to its compression capabilities which is indicated by arrows "C".

In this way, a degradation of the structure shown in FIG. 12 due to mechanical (thermal) stress can be avoided.

Figure 13:
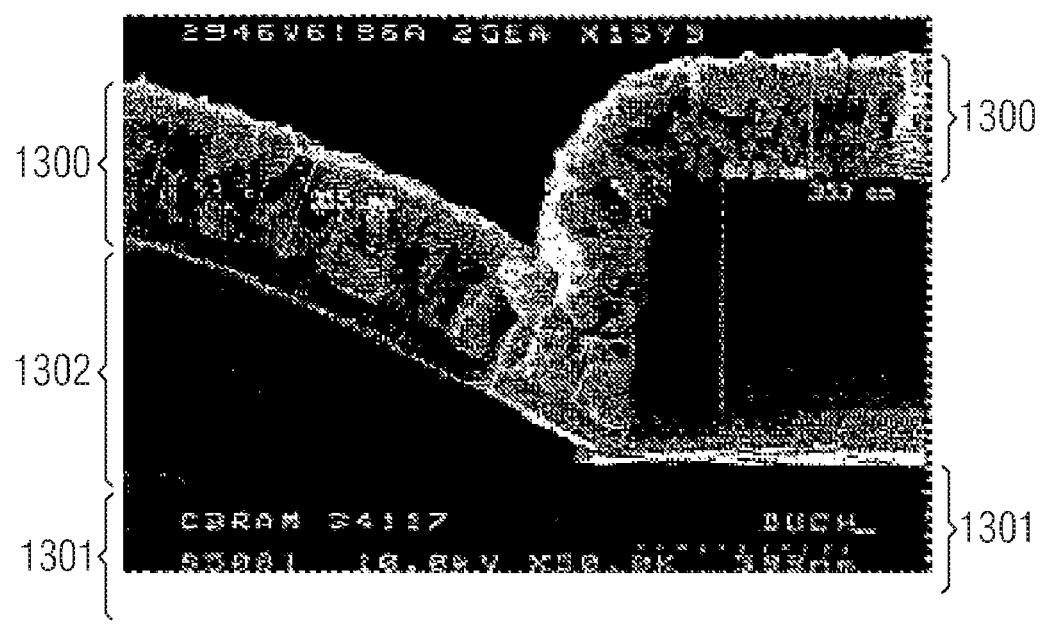
FIG. 13 shows a cross-sectional view of a memory cell array damaged due to high temperature.

FIG. 13 shows the delamination of a stack 1300 of layers disposed above a Si-substrate 1301 after having carried out a thermal annealing process. The stack 1300 of layers is delaminating at an interface between Si based material and $GeS_2$ based material, thereby forming a gap 1302. This demonstrates the problem of thermal expansion.

FIG. 14 shows one embodiment of the fabrication method according to the present invention. In a first process P1, a substrate is provided. In a second process P2, a plurality of layers is deposited on the substrate, the plurality of layers comprising a trench structure. In a third process P3, the trench structure is overgrown such that voids are generated within the trench structure or above the trench structure and/or the trench structure is filled with compressible material or material having a negative thermal expansion coefficient.

As shown in FIGS. 15a and 15b, in some embodiments, memory devices/integrated circuits/memory cell arrays such as those described herein may be used in modules. In FIG. 15a, a memory module 1500 is shown, on which one or more memory devices 1504 are arranged on a substrate 1502. The memory device 1504 may include numerous memory cells, each of which being part of a memory cell array in accordance with an embodiment of the invention. The memory module 1500 may also include one or more electronic devices 1506, which may include memory, processing circuitry, control circuitry, addressing circuitry, bus interconnection circuitry, or other circuitry or electronic devices that may be combined on a module with a memory device, such as the memory device 1504. Additionally, the memory module 1500 includes multiple electrical connections 1508, which may be used to connect the memory module 1500 to other electronic components, including other modules.

As shown in FIG. 15B, in some embodiments, these modules may be stackable, to form a stack 1550. For example, a stackable memory module 1552 may contain one or more memory devices 1556, arranged on a stackable substrate 1554. The memory device 1556 contains memory cells that employ memory elements in accordance with an embodiment of the invention. The stackable memory module 1552 may also include one or more electronic devices 1558, which may include memory, processing circuitry, control circuitry, addressing circuitry, bus interconnection circuitry, or other circuitry or electronic devices that may be combined on a module with a memory device, such as the memory device 1556. Electrical connections 1560 are used to connect the stackable memory module 1552 with other modules in the stack 1550, or with other electronic devices. Other modules in the stack 1550 may include additional stackable memory modules, similar to the stackable memory module 1552 described above, or other types of stackable modules, such as stackable processing modules, control modules, communication modules, or other modules containing electronic components.

According to one embodiment of the invention, the resistivity changing memory cells are phase changing memory cells that include a phase changing material. The phase changing material can be switched between at least two different crystallization states (i.e., the phase changing material may adopt at least two different degrees of crystallization), wherein each crystallization state may be used to represent a memory state. When the number of possible crystallization states is two, the crystallization state having a high degree of crystallization is also referred to as a "crystalline state", whereas the crystallization state having a low degree of crystallization is also referred to as an "amorphous state". Different crystallization states can be distinguished from each other by their differing electrical properties, and in particular by their different resistances. For example, a crystallization state having a high degree of crystallization (ordered atomic structure) generally has a lower resistance than a crystallization state having a low degree of crystallization (disordered atomic structure). For sake of simplicity, it will be assumed in the following that the phase changing material can adopt two crystallization states (an "amorphous state" and a "crystalline state"), however it will be understood that additional intermediate states may also be used.

Phase changing memory cells may change from the amorphous state to the crystalline state (and vice versa) due to temperature changes of the phase changing material. These temperature changes may be caused using different approaches. For example, a current may be driven through the phase changing material (or a voltage may be applied across the phase changing material). Alternatively, a current or a voltage may be fed to a resistive heater which is disposed adjacent to the phase changing material. To determine the memory state of a resistivity changing memory cell, a sensing current may be routed through the phase changing material (or a sensing voltage may be applied across the phase changing material), thereby sensing the resistivity of the resistivity changing memory cell, which represents the memory state of the memory cell.

Figure 16:
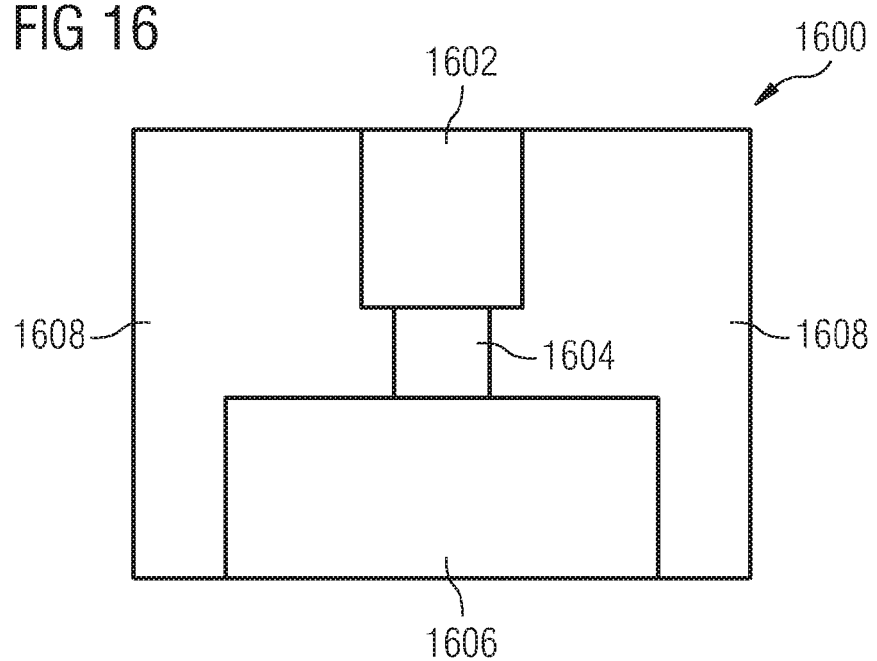
FIG. 16 shows a cross-sectional view of a phase changing memory cell.

FIG. 16 illustrates a cross-sectional view of an exemplary phase changing memory cell 1600 (active-in-via type). The phase changing memory cell 1600 includes a first electrode 1606, a phase changing material 1604, a second electrode 1602, and an insulating material 1608. The phase changing material 1604 is laterally enclosed by the insulating material 1608. To use the phase changing memory cell, a selection device (not shown), such as a transistor, a diode, or another active device, may be coupled to the first electrode 1606 or to the second electrode 1602 to control the application of a current or a voltage to the phase changing material 1604 via the first electrode 1606 and/or the second electrode 1602. To set the phase changing material 1604 to the crystalline state, a current pulse and/or voltage pulse may be applied to the phase changing material 1604, wherein the pulse parameters are chosen such that the phase changing material 1604 is heated above its crystallization temperature, while keeping the temperature below the melting temperature of the phase changing material 1604. To set the phase changing material 1604 to the amorphous state, a current pulse and/or voltage pulse may be applied to the phase changing material 1604, wherein the pulse parameters are chosen such that the phase changing material 1604 is quickly heated above its melting temperature, and is quickly cooled.

The phase changing material 1604 may include a variety of materials. According to one embodiment, the phase changing material 1604 may include or consist of a chalcogenide alloy that includes one or more elements from group VI of the periodic table. According to another embodiment, the phase changing material 1604 may include or consist of a chalcogenide compound material, such as GeSbTe, SbTe, GeTe or AgInSbTe. According to a further embodiment, the phase changing material 1604 may include or consist of chalcogen free material, such as GeSb, GaSb, InSb, or GeGaInSb. According to still another embodiment, the phase changing material 1604 may include or consist of any suitable material including one or more of the elements Ge, Sb, Te, Ga, Bi, Pb, Sn, Si, P, O, As, In, Se, and S.

According to one embodiment, at least one of the first electrode 1606 and the second electrode 1602 may include or consist of Ti, V, Cr, Zr, Nb, Mo, Hf, Ta, W, or mixtures or alloys thereof. According to another embodiment, at least one of the first electrode 1606 and the second electrode 1602 may include or consist of Ti, V, Cr, Zr, Nb, Mo, Hf, Ta, W and two or more elements selected from the group consisting of B, C, N, O, Al, Si, P, S, and/or mixtures and alloys thereof. Examples of such materials include TiCN, TlAlN, TiSiN, W—$Al_2O_3$ and Cr—$Al_2O_3$.

Figure 17:
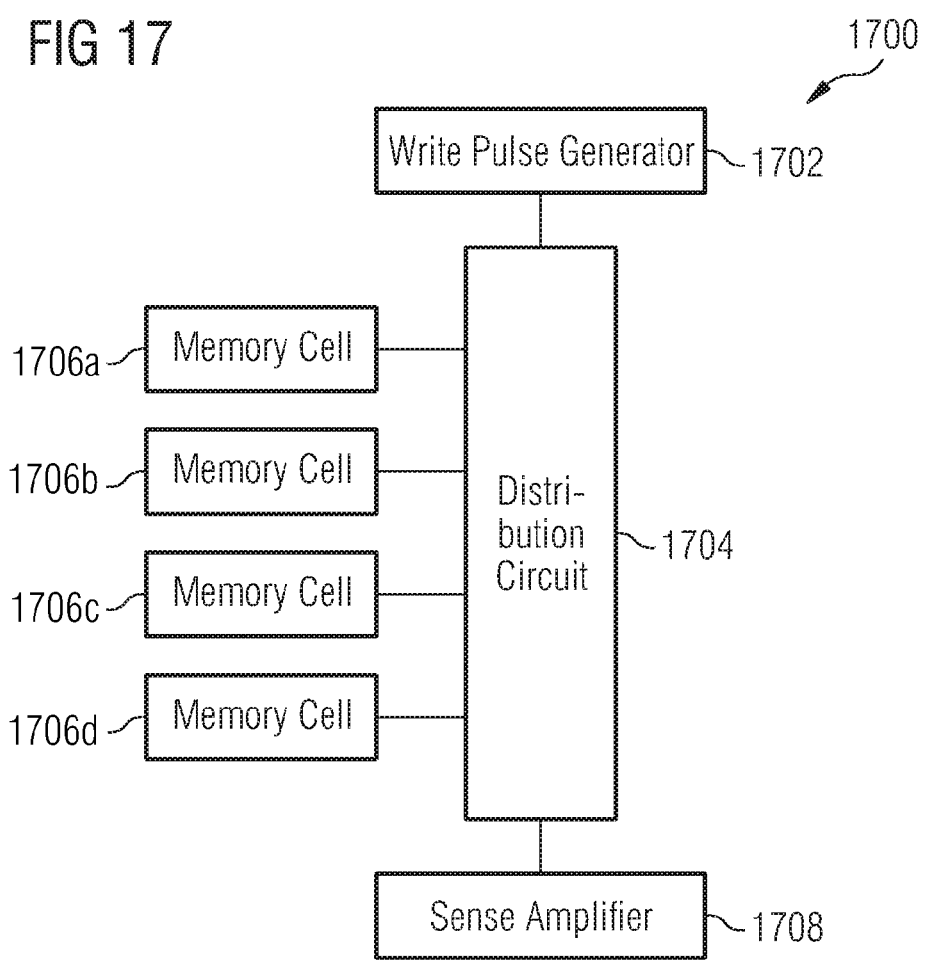
FIG. 17 shows a schematic drawing of a memory device including resistivity changing memory cells.

FIG. 17 illustrates a block diagram of a memory device 1700 including a write pulse generator 1702, a distribution circuit 1704, phase changing memory cells 1706a, 1706b, 1706c, 1706d (for example phase changing memory cells 1700 as shown in FIG. 17), and a sense amplifier 1708. According to one embodiment, a write pulse generator 1705 generates current pulses or voltage pulses that are supplied to the phase changing memory cells 1706a, 1706b, 1706c, 1706d via the distribution circuit 1704, thereby programming the memory states of the phase changing memory cells 1706a, 1706b, 1706c, 1706d. According to one embodiment, the distribution circuit 1704 includes a plurality of transistors that supply direct current pulses or direct voltage pulses to the phase changing memory cells 1706a, 1706b, 1706c, 1706d or to heaters being disposed adjacent to the phase changing memory cells 1706a, 1706b, 1706c, 1706d.

As already indicated, the phase changing material of the phase changing memory cells 1706a, 1706b, 1706c, 1706d may be changed from the amorphous state to the crystalline state (or vice versa) under the influence of a temperature change. More generally, the phase changing material may be changed from a first degree of crystallization to a second degree of crystallization (or vice versa) under the influence of a temperature change. For example, a bit value "0" may be assigned to the first (low) degree of crystallization, and a bit value "1" may be assigned to the second (high) degree of crystallization. Since different degrees of crystallization imply different electrical resistances, the sense amplifier 1708 is capable of determining the memory state of one of the phase changing memory cells 1706a, 1706b, 1706c, or 1706d in dependence on the resistance of the phase changing material.

To achieve high memory densities, the phase changing memory cells 1706a, 1706b, 1706c, 1706d may be capable of storing multiple bits of data, i.e., the phase changing material may be programmed to more than two resistance values. For example, if a phase changing memory cell 1706a, 1706b, 1706c, 1706d is programmed to one of three possible resistance levels, 1.5 bits of data per memory cell can be stored. If the phase changing memory cell is programmed to one of four possible resistance levels, two bits of data per memory cell can be stored, and so on.

The embodiment shown in FIG. 17 may also be applied in a similar manner to other types of resistivity changing memory cells like programmable metallization cells (PMCs), magento-resistive memory cells (e.g., MRAMs) or organic memory cells (e.g., ORAMs).

Another type of resistivity changing memory cell may be formed using carbon as a resistivity changing material. Generally, amorphous carbon that is rich is $sp^3$-hybridized carbon (i.e., tetrahedrally bonded carbon) has a high resistivity, while amorphous carbon that is rich in $sp^2$-hybridized carbon (i.e., trigonally bonded carbon) has a low resistivity. This difference in resistivity can be used in a resistivity changing memory cell.

In one embodiment, a carbon memory cell may be formed in a manner similar to that described above with reference to phase changing memory cells. A temperature-induced change between an $sp^3$-rich state and an $sp^2$-rich state may be used to change the resistivity of an amorphous carbon material. These differing resistivities may be used to represent different memory states. For example, a high resistance $sp^3$-rich state can be used to represent a "0", and a low resistance $sp^2$-rich state can be used to represent a "1". It will be understood that intermediate resistance states may be used to represent multiple bits, as discussed above.

Generally, in this type of carbon memory cell, application of a first temperature causes a change of high resistivity $sp^3$-rich amorphous carbon to relatively low resistivity $sp^2$-rich amorphous carbon. This conversion can be reversed by application of a second temperature, which is typically higher than the first temperature. As discussed above, these temperatures may be provided, for example, by applying a current and/or voltage pulse to the carbon material. Alternatively, the temperatures can be provided by using a resistive heater that is disposed adjacent to the carbon material.

Another way in which resistivity changes in amorphous carbon can be used to store information is by field-strength induced growth of a conductive path in an insulating amorphous carbon film. For example, applying voltage or current pulses may cause the formation of a conductive $sp^2$ filament in insulating $sp^3$-rich amorphous carbon. The operation of this type of resistive carbon memory is illustrated in FIGS. 4a and 4b.

Figure 18A:
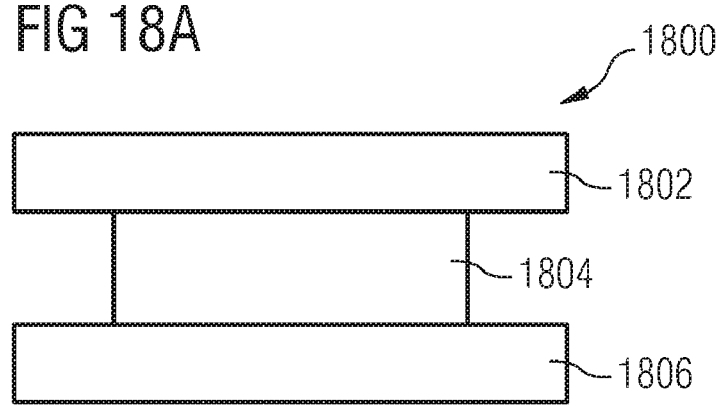
FIG. 18a shows a cross-sectional view of a carbon memory cell set to a first switching state.
Figure 18B:
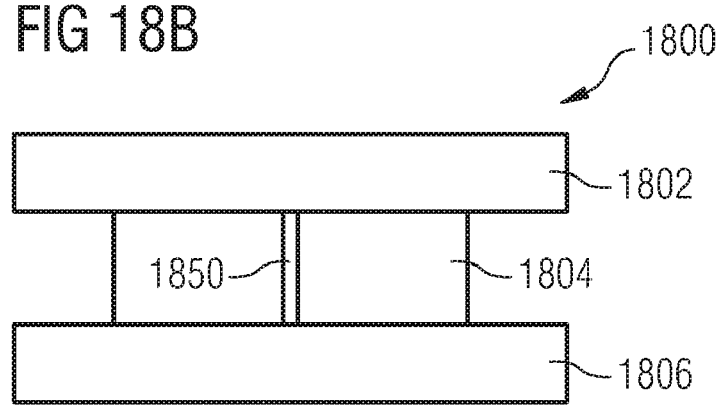
FIG. 18b shows a cross-sectional view of a carbon memory cell set to a second switching state.

FIG. 18a shows a carbon memory cell 1800 that includes a top contact 1802, a carbon storage layer 1804 including an insulating amorphous carbon material rich in $sp^3$-hybridized carbon atoms, and a bottom contact 1806. As shown in FIG. 18b, by forcing a current (or voltage) through the carbon storage layer 1804, an $sp^2$ filament 1850 can be formed in the $sp^3$-rich carbon storage layer 1804, changing the resistivity of the memory cell. Application of a current (or voltage) pulse with higher energy (or, in some embodiments, reversed polarity) may destroy the $sp^2$ filament 1850, increasing the resistance of the carbon storage layer 1804. As discussed above, these changes in the resistance of the carbon storage layer 1804 can be used to store information, with, for example, a high resistance state representing a "0" and a low resistance state representing a "1". Additionally, in some embodiments, intermediate degrees of filament formation or formation of multiple filaments in the $sp^3$-rich carbon film may be used to provide multiple varying resistivity levels, which may be used to represent multiple bits of information in a carbon memory cell. In some embodiments, alternating layers of $sp^3$-rich carbon and $sp^2$-rich carbon may be used to enhance the formation of conductive filaments through the $sp^3$-rich layers, reducing the current and/or voltage that may be used to write a value to this type of carbon memory.

Figure 19A:
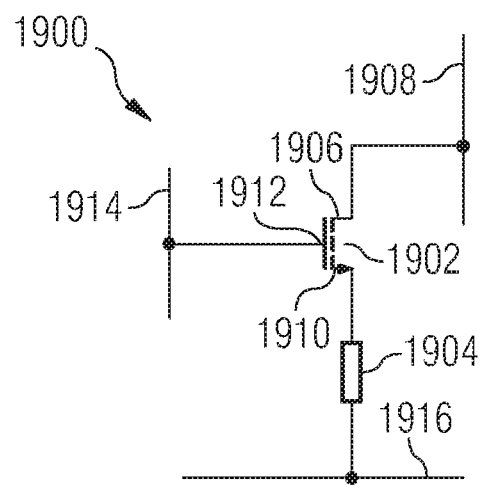
FIG. 19a shows a schematic drawing of a resistivity changing memory cell.

Resistivity changing memory cells, such as the phase changing memory cells and carbon memory cells described above, may include a transistor, diode, or other active component for selecting the memory cell. FIG. 19a shows a schematic representation of such a memory cell that uses a resistivity changing memory element. The memory cell 1900 includes a select transistor 1902 and a resistivity changing memory element 1904. The select transistor 1902 includes a source 1906 that is connected to a bit line 1908, a drain 1910 that is connected to the memory element 1904, and a gate 1912 that is connected to a word line 1914. The resistivity changing memory element 1904 also is connected to a common line 1916, which may be connected to ground, or to other circuitry, such as circuitry (not shown) for determining the resistance of the memory cell 1900, for use in reading. Alternatively, in some configurations, circuitry (not shown) for determining the state of the memory cell 1900 during reading may be connected to the bit line 1908. It should be noted that as used herein the terms connected and coupled are intended to include both direct and indirect connection and coupling, respectively.

To write to the memory cell 1900, the word line 1914 is used to select the memory cell 1900, and a current (or voltage) pulse on the bit line 1908 is applied to the resistivity changing memory element 1904, changing the resistance of the resistivity changing memory element 1904. Similarly, when reading the memory cell 1900, the word line 1914 is used to select the cell 1900, and the bit line 1908 is used to apply a reading voltage (or current) across the resistivity changing memory element 1904 to measure the resistance of the resistivity changing memory element 1904.

Figure 19B:
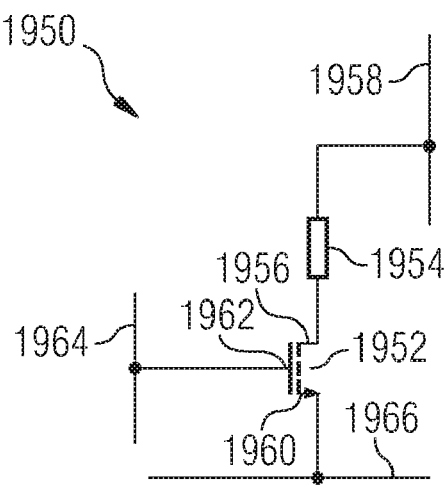
FIG. 19b shows a schematic drawing of a resistivity changing memory cell.

The memory cell 1900 may be referred to as a 1T1J cell, because it uses one transistor, and one memory junction (the resistivity changing memory element 1904). Typically, a memory device will include an array of many such cells. It will be understood that other configurations for a 1T1J memory cell, or configurations other than a 1T1J configuration may be used with a resistivity changing memory element. For example, in FIG. 19B, an alternative arrangement for a 1T1J memory cell 1950 is shown, in which a select transistor 1952 and a resistivity changing memory element 1954 have been repositioned with respect to the configuration shown in FIG. 19a. In this alternative configuration, the resistivity changing memory element 1954 is connected to a bit line 1958, and to a source 1956 of the select transistor 1952. A drain 1960 of the select transistor 1952 is connected to a common line 1966, which may be connected to ground, or to other circuitry (not shown), as discussed above. A gate 1962 of the select transistor 1952 is controlled by a word line 1964.

In the following description, further aspects of embodiments of the invention will be explained.

An embodiment of the invention relates to the manufacturing of non-volatile memories, for example, conductive bridging (CB) RAM memories. The concept of this memory type relies on the creation or destruction of conductive bridges formed by a metal within a chalcogenide glass matrix upon application of a voltage that is larger than a certain positive threshold voltage to form the bridge, or larger (more negative) than a certain negative threshold voltage to erase the bridge. The information stored in this bridge can be read with an intermediate voltage. Compared to current technologies (eg., DRAM, Flash) this approach offers continued scalability down to very small features sizes combined with non-volatility, fast programming and low power consumption.

A metal which may be used for the formation of the conductive bridges is silver (Ag) since it has a high mobility within the matrix and thus allows building a fast switching memory. As chalcogenide materials germanium sulfide or germanium selenide compounds are under investigation.

However, silver (Ag), selenium (Se) and sulfur (S) based materials have large thermal expansion coefficients as can be seen from the expansion coefficient list below:

| | |
|---|---|
| Ge | $6.0 \cdot 10^{-6}/K$ |
| Ag | $19.0 \cdot 10^{-6}/K$ |
| S | $36.0 \cdot 10^{-6}/K$ |
| $SiO_2$ | $0.5 \cdot 10^{-6}/K$ |
| $Si_3N_4$ | $3.3 \cdot 10^{-6}/K$ |

Since the thermal expansion coefficients of standard inter layer dielectricum (ILD) materials like silicon oxide ($SiO_2$) or silicon nitride (SiN, e.g. $Si_3N_4$) significantly differ from the thermal expansion coefficients of silver (Ag), selenium (Se), sulfur (S) or similar materials, mechanical stress is generated during annealing processes.

According to one embodiment of the present invention, a hole-patterned (cheesed) active material plate is formed instead of a continuous active material plate. For this process an additional lithography step may be required to define the areas where the etching/cheesing is supposed to be done. In this way, voids are introduced into the CBRAM cell areas.

The etching ("cheesing") process does not necessarily have to etch away all of the plate/active material. Some active material and/or plate (top electrode) can be left in between the cells after the etching. After the "cheesing" process there is a film deposition process which overgrows the trenches between the individual CBRAM cells. This process can be a CVD process (or a physical vapour deposition (PVD) process). The material to be deposited can be a dielectric or a semi conducting material. After this processing a standard back end of line (BEOL) process including the generation of one or several metal layers, dielectric isolations, metallic contacts, and final encapsulations can be carried out.

Memory devices may use a complete (continuous) plate of CBRAM-active material with a common metal contact on one side and single via-contacts on the other side of the active material. Due to the significant thermal expansion of the above mentioned material delamination or other general material failures can occur during integration steps performed at elevated temperatures that are following the deposition of the active material.

According to one embodiment of the present invention, a hole-patterned (cheesed) active material plate is used instead of a continuous plate. The holes of the patterned active material plate are then filled with nanoporous material that can easily be compressed or with a material that is exhibiting a negative thermal expansion coefficient, e.g., $ZrW_2O_8$.

According to one embodiment of the present invention, stacked levels of CBRAM active materials are used. The hole patterning may be limited to a part of the active material stack.

As used herein the terms connected and coupled are intended to include both direct and indirect connection and coupling, respectively.

The foregoing description has been presented for purposes of illustration and description. It is not intended to be exhaustive or to limit the invention to the precise form disclosed, and obviously many modifications and variations are possible in light of the disclosed teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined solely by the claims appended hereto.

What is claimed is:

1. An integrated circuit comprising a memory cell array comprising a plurality of voids, spatial positions and dimensions of the voids being chosen such that mechanical stress occurring within the memory cell array is at least partly compensated by the voids, wherein the memory cell array comprises a solid electrolyte random access memory cell array comprising a reactive electrode layer, an inert electrode layer, and a solid electrolyte layer positioned between the reactive electrode layer and the inert electrode layer, the solid electrolyte layer being electrically connected to the reactive electrode layer and the inert electrode layer, and wherein at least a part of at least one void is located within at least one of the solid electrolyte layer, the inert electrode layer, the reactive electrode layer, and at least one dielectric layer that is disposed above the solid electrolyte layer.

2. The integrated circuit according to claim 1, wherein at least a part of at least one void is filled with compressible material or material having a negative thermal expansion coefficient.

3. The integrated circuit according to claim 2, wherein the compressible material comprises a nanoporous material.

4. The integrated circuit according to claim 1, wherein the memory cell array comprises a resistive memory cell array.

5. The integrated circuit according to claim 1, wherein the memory cell array comprises a non-volatile memory cell array.

6. The integrated circuit according to claim 1, wherein the memory cell array comprises an active material layer, at least a part of at least one void being located within the active material layer.

7. The integrated circuit according to claim 6, wherein all voids are located within the active material layer.

8. The integrated circuit according to claim 1, wherein all voids are located within at least one dielectric material layer.

9. The integrated circuit according to claim 6, wherein all voids are located within at least one dielectric material layer that is disposed above an active material layer and/or an electrode layer that is disposed above the active material layer.

10. The integrated circuit according to claim 2, wherein at least part of at least one void is filled with a material having a negative thermal expansion coefficient, the material comprising a compound.

11. The integrated circuit according to claim 10, wherein the material having a negative thermal expansion coefficient comprises $ZrW_2O_8$.

12. An integrated circuit comprising a memory cell array comprising a plurality of mechanical stress compensation areas, each stress compensation area comprising compressible material or material having a negative thermal expansion coefficient, spatial positions and dimensions of the stress compensation areas being chosen such that mechanical stress occurring within the memory cell array is at least partly compensated by the stress compensation areas,
wherein the memory cell array comprises a programmable metallization cell array,
wherein the memory cell array comprises a reactive electrode layer, an inert electrode layer, and a solid electrolyte layer that is positioned between the reactive electrode layer and the inert electrode layer, the solid electrolyte layer being electrically connected to the reactive electrode layer and the inert electrode layer, and
wherein at least a part of at least one stress compensation area is located within at least one of the solid electrolyte layer, the inert electrode layer, the reactive electrode layer, and at least one dielectric layer that is disposed above the solid electrolyte layer.

13. The integrated circuit according to claim 12, wherein each stress area comprises a compressible material, the compressible material comprising a nanoporous material.

14. The integrated circuit according to claim 12, wherein the memory cell array comprises a resistive memory cell array.

15. The integrated circuit according to claim 12, wherein the memory cell array comprises a non-volatile memory cell array.

16. The integrated circuit according to claim 12, wherein at least one stress compensation area comprises a trench structure, the trench structure being at least partially filled with the compressible material or the material having a negative thermal expansion coefficient.

17. The integrated circuit according to claim 12, wherein the memory cell array comprises an active material layer, at least a part of at least one stress compensation area being located within the active material layer.

18. The integrated circuit according to claim 17, wherein all stress compensation areas are located within the active material layer.

19. The integrated circuit according to claim 17, wherein all stress compensation areas are located within a dielectric material layer that is disposed above the active material layer.

20. The integrated circuit according to claim 12, wherein the memory cell array comprises a phase changing memory cell array.

21. The integrated circuit according to claim 12, further comprising a plurality of voids, spatial positions and dimensions of the voids being chosen such that mechanical stress occurring within the memory cell array is at least partly compensated by the voids.

22. The integrated circuit according to claim 12, wherein each stress compensation area comprises $ZrW_2O_8$.

23. A memory cell array comprising a plurality of voids, spatial positions and dimensions of the voids being chosen such that mechanical stress occurring within the memory cell array is at least partly compensated by the voids,
wherein the memory cell array comprises a solid electrolyte random access memory cell array comprising a reactive electrode layer, an inert electrode layer, and a solid electrolyte layer positioned between the reactive electrode layer and the inert electrode layer, the solid electrolyte layer being electrically connected to the reactive electrode layer and the inert electrode layer, and
wherein at least a part of at least one void is located within at least one of the solid electrolyte layer, the inert electrode layer, the reactive electrode layer, and the at least one dielectric layer that is disposed above the solid electrolyte layer.

24. A memory cell array comprising a plurality of mechanical stress compensation areas, each stress compensation area comprising compressible material or material having a negative thermal expansion coefficient; and spatial positions and dimensions of the stress compensation areas being chosen such that mechanical stress occurring within the memory cell array is at least partly compensated by the stress compensation areas,
wherein the memory cell array comprises a programmable metallization cell array,
wherein the memory cell array comprises a reactive electrode layer, an inert electrode layer, and a solid electrolyte layer that is positioned between the reactive electrode layer and the inert electrode layer, the solid electrolyte layer being electrically connected to the reactive electrode layer and the inert electrode layer, and
wherein at least a part of at least one stress compensation area is located within at least one of the solid electrolyte layer, the inert electrode layer, the reactive electrode layer, and at least one dielectric layer that is disposed above the solid electrolyte layer.

25. A memory module comprising at least one memory device comprising a memory cell array that comprises a plurality of voids, spatial positions and dimensions of the voids being chosen such that mechanical stress occurring within the memory cell array is at least partly compensated by the voids, wherein the memory module comprises a solid electrolyte random access memory cell array comprising a reactive electrode layer, an inert electrode layer, and a solid electrolyte layer positioned between the reactive electrode layer and the inert electrode layer, the solid electrolyte layer being electrically connected to the reactive electrode layer and the inert electrode layer, and wherein at least a part of at least one void is located within at least one of the solid electrolyte layer, the inert electrode layer, the reactive electrode layer, and at least one dielectric layer that is disposed above the solid electrolyte layer.

26. A memory module comprising at least one memory device comprising a memory cell array that comprises a plurality of mechanical stress compensation areas, each stress compensation area comprising compressible material or material having a negative thermal expansion coefficient; and spatial positions and dimensions of the stress compensation areas being chosen such that mechanical stress occurring within the memory cell array is at least partly compensated by the stress compensation areas, wherein the memory module comprises a programmable metallization cell array, wherein the memory cell array comprises a reactive electrode layer, an inert electrode layer, and a solid electrolyte layer that is positioned between the reactive electrode layer and the inert electrode layer, the solid electrolyte layer being electrically connected to the reactive electrode layer and the inert electrode layer, and wherein at least a part of at least one stress compensation area is located within at least one of the solid electrolyte layer, the inert electrode layer, the reactive electrode layer, and at least one dielectric layer that is disposed above the solid electrolyte layer.

27. The memory module according to claim 26, wherein the memory module is stackable.

28. A semiconductor device comprising a plurality of voids, spatial positions and dimensions of the voids being chosen such that mechanical stress occurring within the device is at least partly compensated by the voids, wherein the semiconductor device comprises a solid electrolyte random access memory cell array comprising a reactive electrode layer, an inert electrode layer, and a solid electrolyte layer positioned between the reactive electrode layer and the inert electrode layer, the solid electrolyte layer being electrically connected to the reactive electrode layer and the inert electrode layer, and wherein at least a part of at least one void is located within at least one of the solid electrolyte layer, the inert electrode layer, the reactive electrode layer, and at least one dielectric layer that is disposed above the solid electrolyte layer.

* * * * *